United States Patent [19]

Hwang et al.

[11] Patent Number: 5,777,491
[45] Date of Patent: Jul. 7, 1998

[54] HIGH-PERFORMANCE DIFFERENTIAL CASCODE VOLTAGE SWITCH WITH PASS GATE LOGIC ELEMENTS

[75] Inventors: Wei Hwang, Armonk, N.Y.; Fang-Shi Jordan Lai, San Jose, Calif.

[73] Assignee: International Business Machines Corporation, Armonk, N.Y.

[21] Appl. No.: 660,836

[22] Filed: Jun. 10, 1996

Related U.S. Application Data

[63] Continuation of Ser. No. 414,069, Mar. 31, 1995, abandoned.

[51] Int. Cl.$^6$ .................................... H03K 19/0948
[52] U.S. Cl. ...................... 326/113; 326/17; 326/98; 326/121
[58] Field of Search ...................... 326/113, 112, 326/119, 121, 95, 98, 17, 27–28

[56] References Cited

U.S. PATENT DOCUMENTS

| | | | |
|---|---|---|---|
| 4,541,067 | 9/1985 | Whitaker | 326/113 |
| 4,620,117 | 10/1986 | Fang | 326/113 |
| 5,399,921 | 3/1995 | Dobbelaere | 326/113 |
| 5,418,480 | 5/1995 | Hastie | 326/113 |

OTHER PUBLICATIONS

Rhyne. *Fundamentals of Digital Systems Design*. Prentice-Hall, New Jersey. 1973. pp. 70–71.

*Primary Examiner*—Edward P. Westin
*Assistant Examiner*—Jon Santamauro
*Attorney, Agent, or Firm*—Whitham, Curtis & Whitham; Robert P. Tassinari, Jr.

[57] ABSTRACT

Performance of a dual cascode voltage switch is improved and floating node effects including charge sharing and ratioing of output voltages are avoided by constituting the true and complement logic trees as pass gates of equal height, preferably limited, where possible, to a single transistor. The logic trees have substantially identical transistor layout configurations and different logic functions are established by selective connection of control and conduction terminals of the pass gates to reference logic level voltages of true and complement input variable signal values.

20 Claims, 14 Drawing Sheets

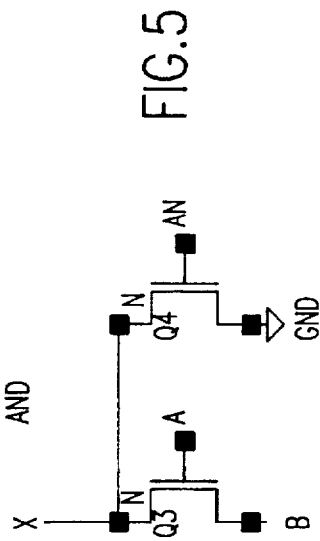
FIG. 5
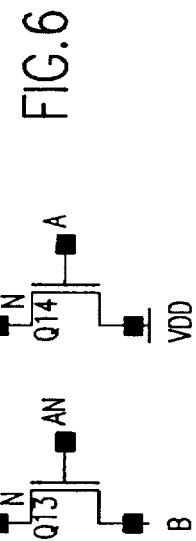
FIG. 6
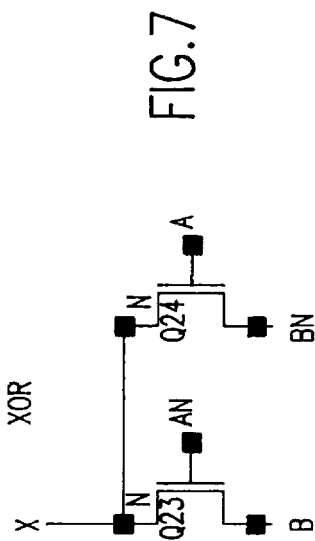
FIG. 7
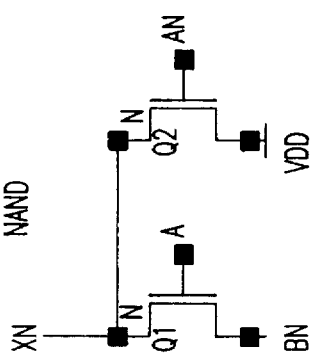
AND/NAND
Truth Table
| A | B | X | XN |
|---|---|---|----|
| 0 | 0 | 0 | 1  |
| 0 | 1 | 0 | 1  |
| 1 | 0 | 0 | 1  |
| 1 | 1 | 1 | 0  |
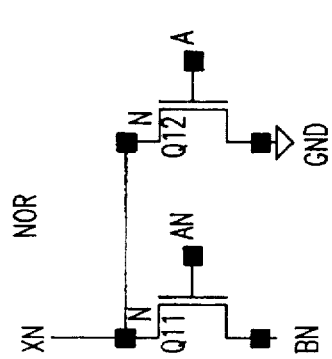
OR/NOR
Truth Table
| A | B | X | XN |
|---|---|---|----|
| 0 | 0 | 0 | 1  |
| 0 | 1 | 1 | 0  |
| 1 | 0 | 1 | 0  |
| 1 | 1 | 1 | 0  |
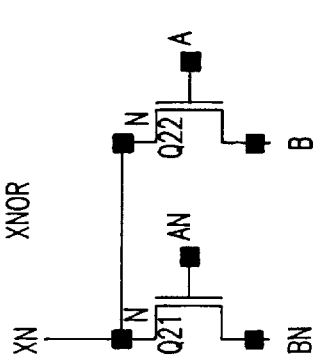
XOR/XNOR
Truth Table
| A | B | X | XN |
|---|---|---|----|
| 0 | 0 | 0 | 1  |
| 0 | 1 | 1 | 0  |
| 1 | 0 | 1 | 0  |
| 1 | 1 | 0 | 1  |

TABLE 1

| | Gate Input Capacitance (fF) | Load Output Capacitance (fF) | P / N | Normalized Area | Delay (ps) | Power (μW) | Normalized Power-Delay Product |
|---|---|---|---|---|---|---|---|
| Static CMOS | 144 | 144 | 8/8 | 1.00 | 198 | 90 | 1.00 |
| Static DCVS | 96 | 96 | 2/10 | 0.58 | 235 | 168 | 2.21 |
| Static DCVSPG | 64 | 64 | 2/8 | 0.42 | 166 | 114 | 1.06 |
| Dynamic DCVS | 96 | 192 | 4/12 -6/15 | 1.05 | 117 | 115 | 0.78 |
| Dynamic DCVSPG | 84 | 128 | 4/10 -6/14 | 1.03 | 70 | 102 | 0.41 |

HIGH-PERFORMANCE DIFFERENTIAL CASCODE VOLTAGE SWITCH WITH PASS GATE LOGIC ELEMENTS

DESCRIPTION

This application is a continuation of application Ser. No. 08/414,069 filed Mar. 31, 1995 now abandoned.

BACKGROUND OF THE INVENTION

1. Field of the Invention

The present invention generally relates to electronic circuits capable of performing digital logic functions and, more particularly, to static and dynamic logic circuits capable of delivering true and complement outputs and arrays thereof.

2. Description of the Prior Art

Circuits capable of performing logical operations on combinations of digital signals have been known for many years and have become widely used in many types of electronic devices. Complex arrays of many such circuits are used in data processing devices such as in central processors (CPUs), peripheral circuits such as decoders and control circuits which may be integrated with memories and the like.

Demands for increasing speed of response and processing power of various devices and computers, of course, requires reduction in signal propagation time through most if not all of the logic circuits which may be included therein. While many different circuits may have equivalent logic functions, the switching speed and other parameters of quantitative electrical performance may vary greatly with circuit design and the technology with which the circuit is implemented. Accordingly, designs of logic circuits for various logic functions have become highly refined and are capable of very high levels of performance. The same is true of the technologies on which individual transistors of such logic circuits are based. However, some inherent characteristics of the most advanced transistor designs cause the performance of the logic circuits in which they are employed to be less than optimal or to present problems or operational modes which are less than fully desirable.

For example, logic circuits of designs generally known for many years consisted of arrays of transistors where the output depended solely upon the voltages applied to the respective transistor inputs at any given time. More recently, asymmetries of response time and properties of capacitive charge storage nodes of NMOS and PMOS transistors used in the CMOS transistor technology of choice for high speed circuits has led to adoption of a so-called dynamic mode of operation in which each transistor is precharged in the absence of an input signal to a state from which it may be most rapidly switched to the opposite logic state when an input is applied, and then only when the input requires such a change of logic state. It should be noted that the charge in the capacitive nodes acts as the logic parameter and can quickly be transferred using transistor networks. Circuits designed to operate in this latter mode are thus referred to as dynamic logic circuits and, for purposes of distinction, logic circuits of earlier design operating on contemporaneous combinations of input signals (and which may or may not include latching functions at the input or output thereof), as described above, are referred to as static logic circuits. It is also possible to design logic circuits which may be operated in either dynamic or static mode and response time in each of the two modes must be optimized, consistent with maintaining suitable operational characteristics.

For example, a known form of logic circuit which can be operated in either the static or dynamic mode (with the addition of precharge transistors which are omitted from the illustration in the interest of clarity) is shown in FIG. 1 and commonly known as a differential cascode voltage switch (DCVS). The DCVS is generally considered to possess advantageous characteristics of flexibility of logic function, low circuit delay and power dissipation and requires only a small chip area for fabrication. This circuit includes a pair of cross-coupled pull-up loads providing a true (Q) and complement ($Q_N$) outputs. In this case, the loads are PMOS transistors. Each of the output nodes is connected to a true or complement logic tree or block (e.g. n-blocks 11, 12 for NMOS transistors), each comprised of a plurality of NMOS transistors connected to perform complementary logic functions. Any desired logic function can be obtained in the circuit without significant change of circuit operational characteristics by the particular connection configuration chosen for the true 11 and complement 12 logic trees. In the exemplary AND gate shown, Q=AB and $Q_N=A_N+B_N$.

However, this DCVS circuit is a ratio circuit and, as such, has some significant drawbacks and disadvantages in both the static and dynamic modes of operation. When one of the n-blocks 11, 12 conducts to pull down one of the output nodes to ground or other reference voltage, the other output node will float, (for example A=1, B=0) because both the other logic block (e.g. n-block) and its load (e.g. p-load) will be essentially non-conductive, until a corresponding one of the cross-coupled p-loads becomes sufficiently more conductive than the other to provide positive feedback and establish a stable state. The floating node causes the DCVS output, when operated in a static mode, to be ratioed in voltage divider fashion, creating current spikes due to the potential variation of the switching times of the logic trees and the load as signals propagate, and increased power dissipation and increased signal propagation delay.

This problem may be exacerbated by differing stack height (e.g. the number of serially connected transistors required to achieve the desired logic functions) of the logic trees on the respective sides of the DCVS. While the ratioed logic effect can be avoided by the precharging characteristic of dynamic operation, static operation of some stages of a logic circuit may be desired in a particular design including a plurality of serially connected logic stages. Hence, the device size ratio between the PMOS load and the NMOS logic transistors must be carefully chosen in order to make the ratio circuit function properly. The floating and somewhat unpredictably ratioed output voltage also makes such a circuit unreliable as an input to subsequent logic stages that may be operated in a dynamic mode.

Further, even in the dynamic operating mode, the floating node problem cannot be avoided since both loads would be rendered non-conductive during precharging. It will also cause a charge-sharing problem (for example, if A=1, B=0, the charge will share between nodes s and f of FIG. 2). For this reason, a dynamic DCVS is not entirely reliable, particularly for providing an output to a subsequent, serially connected, dynamic logic stage. At extremely high operating speeds and short cycle times, the conventional dynamic DCVS circuit of FIG. 2 is considered to be very unreliable and a major source of potential signal errors.

Both of the above-described effects tend to slow the switching function of the logic circuit and increase power dissipation. Current spikes are a major potential source of electrical noise which may be coupled to other portions of circuitry, particularly at high integration densities. Perhaps more importantly, however, both result in at least a brief period when an ambiguous output will be present at the output nodes. The ambiguous output may be sensed as an erroneous logic level causing charge redistribution problems, particularly by precharged dynamic logic gates, and an erroneous signal may thus be generated and propagated through following serially connected logic gates.

SUMMARY OF THE INVENTION

It is therefore an object of the present invention to provide a DCVS circuit which is not subject to the floating node effect and does not cause a ratioed output voltage to be output.

It is another object of the present invention to provide a DCVS circuit which does not output ambiguous voltage levels while retaining the other advantageous characteristics of small required area of fabrication and low power dissipation.

It is a further object of the invention to provide a DCVS circuit having reduced radiated noise and power dissipation and improved signal propagation time.

It is another object of the invention to provide a DCVS circuit with symmetrical logic topology in the true and complement logic trees and shorter logic stack height.

It is yet another object of the invention to provide a DCVS circuit family using pass gates (hereinafter DCVSPG) for providing desired logic functions.

It is yet another object of the invention to provide a DCVS circuit family to avoid charge-sharing problems in dynamic circuit operations.

It is yet another object of the invention to provide a DCVSPG circuit capable of operation in both static and dynamic modes, respectively.

It is another further object of the invention to provide a DCVS circuit of standardized form and reduced size for increased economy of manufacture and fabrication yield.

In order to accomplish these and other objects of the invention, a dual rail logic circuit is provided including a first logic tree and a second logic tree, both of which comprise pass gates of equal stack height.

In accordance with another aspect of the invention, a dual rail logic circuit is provided comprising first and second output nodes, and a logic circuit connected to each respective output node for receiving logic level voltages corresponding to respective true and complement values of a plurality of input variables and for respectively connecting the first and second output nodes to a logic level voltage for all combinations of said logic level voltages received.

In accordance with a further aspect of the invention, a logic circuit is provided including at least two serially connected logic stages, each including first and second output nodes, and a logic circuit connected to each respective output node for receiving logic level voltages corresponding to respective true and complement values of a plurality of input variables and for respectively connecting the first and second output nodes to a logic level voltage for all combinations of said logic level voltages received.

BRIEF DESCRIPTION OF THE DRAWINGS

The foregoing and other objects, aspects and advantages will be better understood from the following detailed description of a preferred embodiment of the invention with reference to the drawings, in which:

FIGS. 5, 6 and 7 are exemplary and complementary logic trees which provide different logic functions in the DCVS circuit in accordance with the invention.

FIG. 16 is a tabular comparison of conventional DCVS circuits with the invention.

DETAILED DESCRIPTION OF A PREFERRED EMBODIMENT OF THE INVENTION

In the following description and explanation of the invention, a preferred implementation of a 2-input static differential cascode voltage switch with pass gate (DCVSPG) logic circuit will be desribed followed by a desciption of a dynamic DCVSPG circuit. The concept of a 2-input logic circuit will then be extended to 3-input logic sum circuits which will be discussed in terms of static and dynamic DCVSPG circuits, respectively. Then, in order to demonstrate the principles and applicability of the invention to complex logic circuits, a discussion of a 64-bit adder implementation employing the principles of the invention will be discussed.

Figure 1:
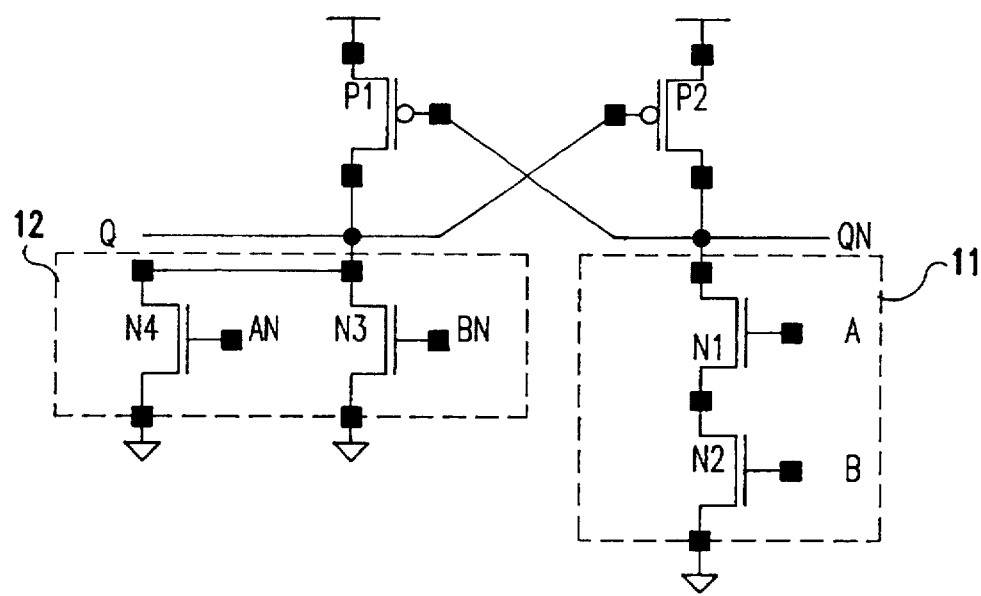
FIGS. 1 and 2 are schematic diagrams of a static and dynamic DCVS circuit, respectively.
Figure 3:
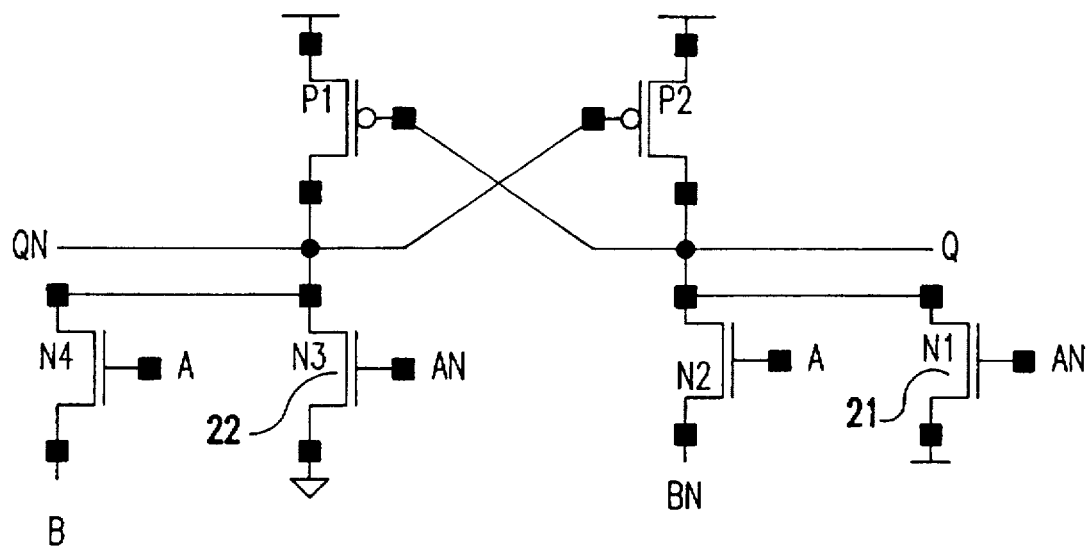
FIGS. 3 and 4 are schematic diagrams of DCVSPG static and dynamic circuits in accordance with the invention, respectively
Figure 4:
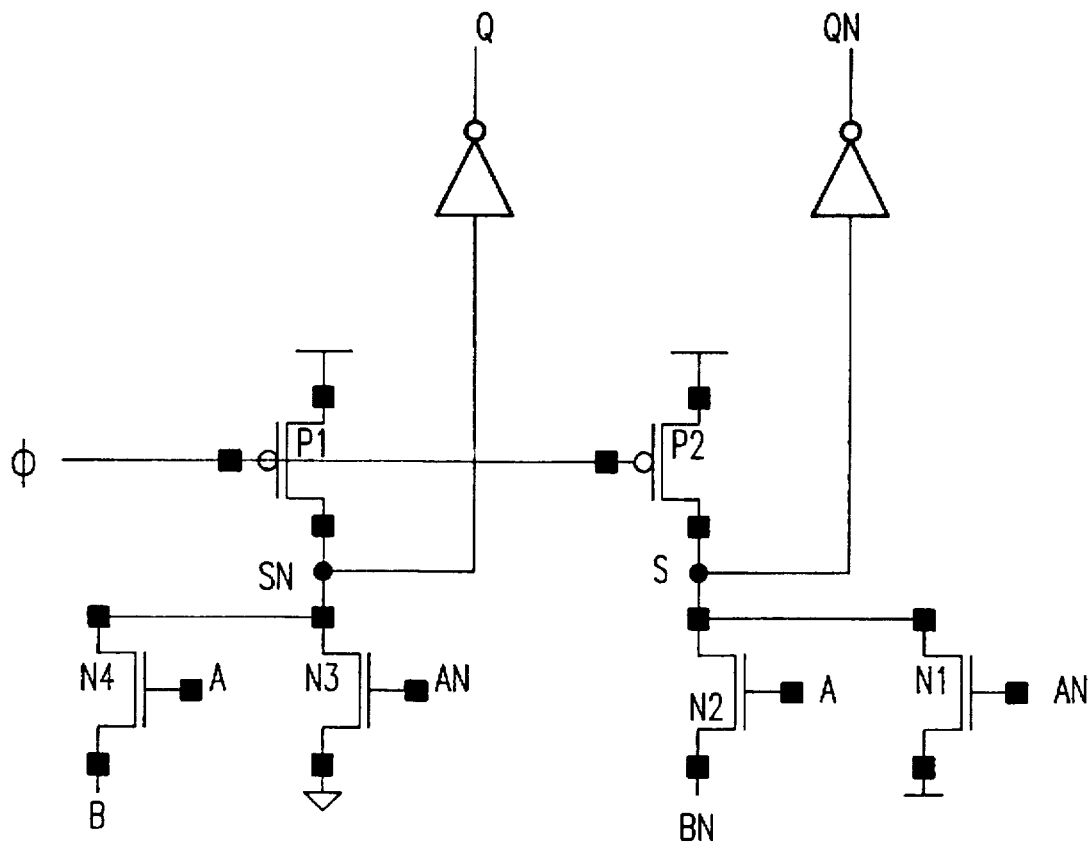

Referring now to the drawings, and more particularly to FIG. 3, there is shown a circuit having a comparable logic function to that of FIG. 1 but employing the principles of the present invention. As in FIG. 1, the circuit in accordance with the invention preferably includes cross-coupled loads for static operation although the load arrangement is not critical to the practice of the invention. For example, as shown in FIG. 4, in a variation of the invention intended for dynamic operation, a precharge transistor is preferably coupled to each output node instead of cross-coupled load transistors.

The circuit of FIG. 3 differs radically from the circuit of FIG. 1 in the circuit blocks which define and perform the desired logic function. In accordance with the invention, these circuits are arranged as pass gates and inputs are connected to both the control and conduction terminals so that a connection is always made from an output node to a logic level voltage, regardless of the combination of logic values of the input variables input to the pass gate. The circuit is therefore referred to as a differential cascode voltage switch with pass gate (DCVSPG).

These pass gates, characteristically, have a minimal stack height (e.g. only one transistor of stack height for logic functions of two input variables) and provide for logic input signals or a high logic voltage level (e.g. $V_{DD}$) to be coupled to some of the conduction terminals (e.g. source or drain) of the pass gate transistors in addition to the control electrodes or gates thereof, as may be dictated by the desired logic functions. It is also characteristic of such pass gates for standard logic functions that both the true and complement logic blocks receive both true and complement input signals and are of symmetrical configuration. In contrast, in the circuit of FIG. 1, the AND logic block has a stack height of two transistors, input signals are coupled only to transistor gates (e.g. control terminals) and the conduction terminals of the transistors of both true and complement logic blocks are serially coupled to a single reference voltage (e.g. ground). Also, the true logic block receives only true logic inputs and the complement logic block receives only complement logic inputs.

In operation, the floating node problem is avoided in either static or dynamic mode by the DCVSPG circuit in accordance with the invention since a conduction path will exist in both logic blocks to some logic level voltage for any combination of inputs. Note, for example, in FIG. 3, that transistors 21 and 22 operate in a mutually exclusive fashion in dependence on the logic value of $A_N$ and serve to connect respective output nodes to either ground or the power supply voltage, supplied as an input variable B and $B_N$. By the same token, since the pass gates are able to clamp the output nodes closely to logic voltages, there is no ratioing of the voltages at the output nodes and no charge sharing occurs. For example, if A=1, B=0, in FIG. 3, then the output node Q will connect to ground and $Q_N$ is connected to the power supply. Therefore, no charge sharing can occur in the circuit of FIG. 3. The use of pass gates provides the same freedom from charge sharing effects in the dynamic circuit of FIG. 4, as will be described in greater detail below.

Pass gate arrangements for logic blocks which will perform other common logic functions are illustrated in FIGS. 5–7, from which any other desired logic function for any number of input variables in accordance with the invention can be readily derived by those skilled in the art. Specifically, FIG. 5 shows the true and complement pass gate logic blocks or trees which may be substituted in the circuit of FIG. 2 to define an AND function with pass gates in accordance with the invention and the corresponding truth table. FIG. 6 similarly illustrates true and complement pass gate logic blocks or trees to define an OR function (and the corresponding truth table) and FIG. 7 illustrates an exclusive-OR (XOR) function (and the corresponding truth table).

It should be noted that the circuits of the logic blocks or trees are identical with the differing functions derived by the connections of the true and complement input signals and reference logic level voltages to gates and conduction terminals of the transistors. Thus, the DCVSPG in accordance with the invention not only provides a family of logic elements but supports the fabrication of all types of logic circuits in the family in a standardized form and layout. For an increased number of inputs, additional transistors would, of course, be required in each logic block or tree but the number of transistors will generally be the same for any logic function having the same number of inputs.

In any case, the number of required transistors can be determined by recursive minimization with the Karnaugh map of the desired logic function. This is clearly seen to be especially advantageous since conductors are generally formed subsequent to completion of transistor fabrication in integrated circuit manufacture. The standardization and symmetry of layout also facilitates increase of integration density (which improves circuit performance, as does reduced transistor stack height in the logic blocks or trees) and standardization of manufacturing processes; all of which tend to increase economy of manufacture and fabrication yield.

Figure 8:
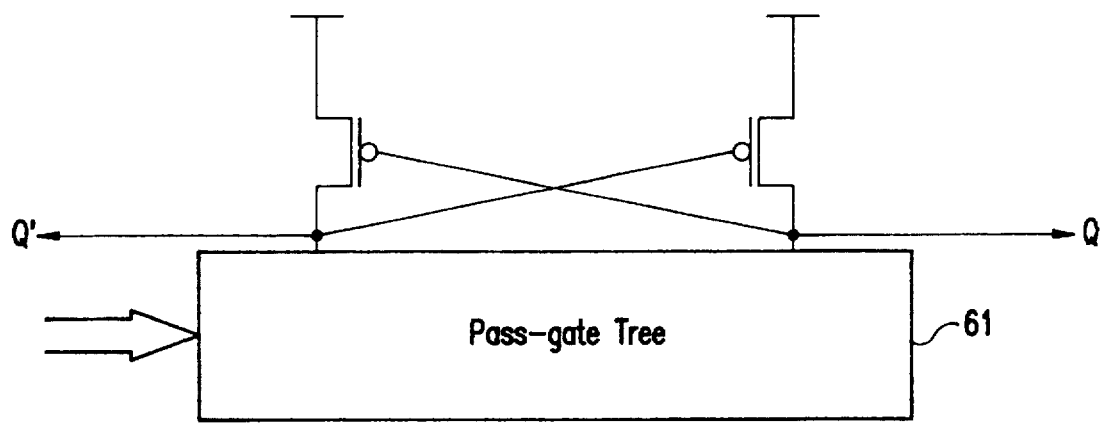
FIGS. 8 and 9 are graphical representations of the performance of the invention.

Since the pass gate trees formed by the true and complement logic blocks or trees can be designed in a standardized manner, a static implementation of the DCVSPG can be depicted in a generalized form as shown in FIG. 8. This is simply the cross-coupled load transistors as shown in FIGS. 1 or 3 connected to a pass gate tree block 61.

Figure 2:
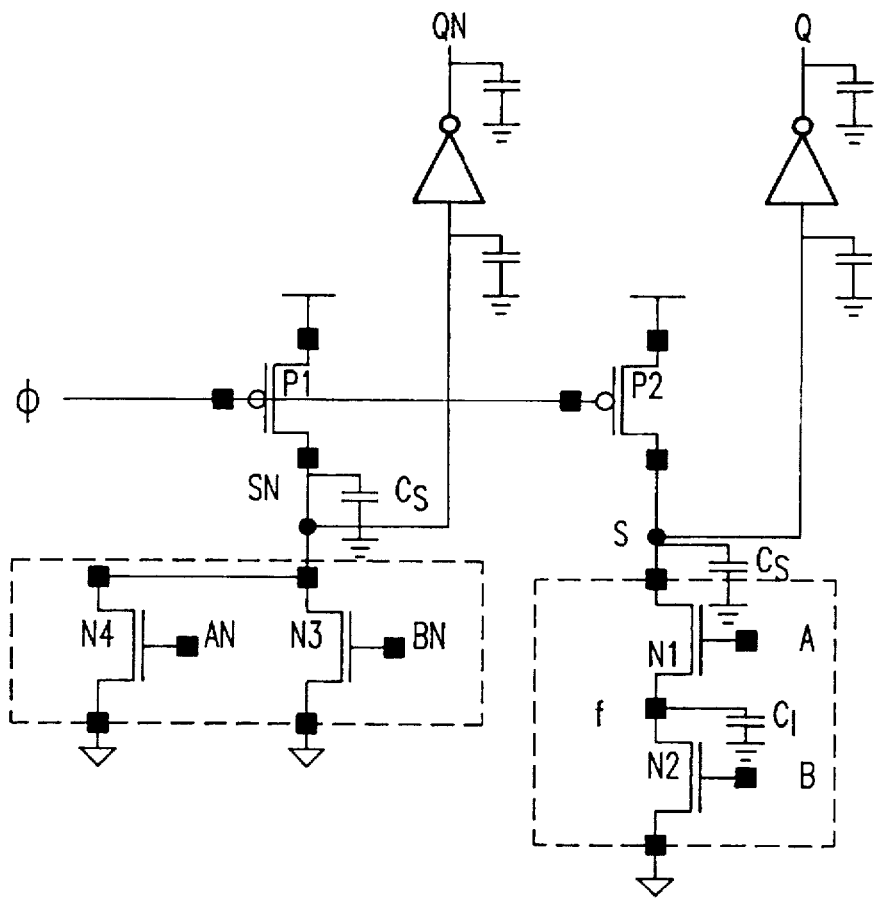

Referring now to FIGS. 2 and 4, a preferred implementation of dynamic logic circuits will now be explained. Specifically, FIG. 2 shows a 2-input NAND/AND logic function implementation of Q=AB, $Q_N=A_N+B_N$ for a dynamic DCVS circuit. The $A_N$ and $B_N$ are the complementary inputs of 2-input logic variables A and B, respectively. FIG. 4 shows a similar logic function provided in dynamic DCVSPG in accordance with the invention. When clock signal φ is low (the precharge period) both S and $S_N$ nodes in FIGS. 2 and 4 are charged up to $V_{DD}$ high level signal. Consequently, both of the dual rail outputs Q and $Q_N$ are low.

When the clock signal φ goes high, both of these circuits will start to evaluate the inputs in accordance with the logic function of the circuit. In the circuit of FIG. 2, (for A=1, B=0) the node SN starts to discharge and the stored charge in node SN will flow through transistor N3 to ground.

At the same time, node S is floating at a high logic voltage (e.g. $V_{DD}$) since transistor N2 is non-conductive. Charge leakage from the parasitic capacitances of the node to the substrate will occur whenever node S is brought to a high logic level. Charge sharing problems tending to pull the voltage away from a high logic level $V_{DD}$ will occur during evaluation whenever less than all transistors (e.g. N1 but not N2) in the logic block or tree are conductive since charge is shared among the parasitic capacitances such as $C_S$, $C_X$ and $C_1$ and will be redistributed among these parasitic capacitances, depending on which transistors are conductive to connect various ones of the parasitic capacitances to each other during evaluation when the precharge transistor (e.g. P2) is non-conducting and the node is floating due to a non-conducting state of one or more transistors.

In contrast, in the dynamic DCVSPG circuit of FIG. 4, in accordance with the invention, for the same input logic values (A=1, B=0), the node SN is discharged through transistor N4 to Node B which is in the logic low or ground state. The node S is connected to the logic high ($V_{DD}$) state voltage at $B_N$ through transistor N2. Thus there are no charge redistribution or floating node (e.g. loss of charge to the substrate through leakage) problems encountered in the operation of the circuit in accordance with the invention since both output nodes are connected to logic level voltages during evaluation, regardless of the combination of input variables.

Figure 9:
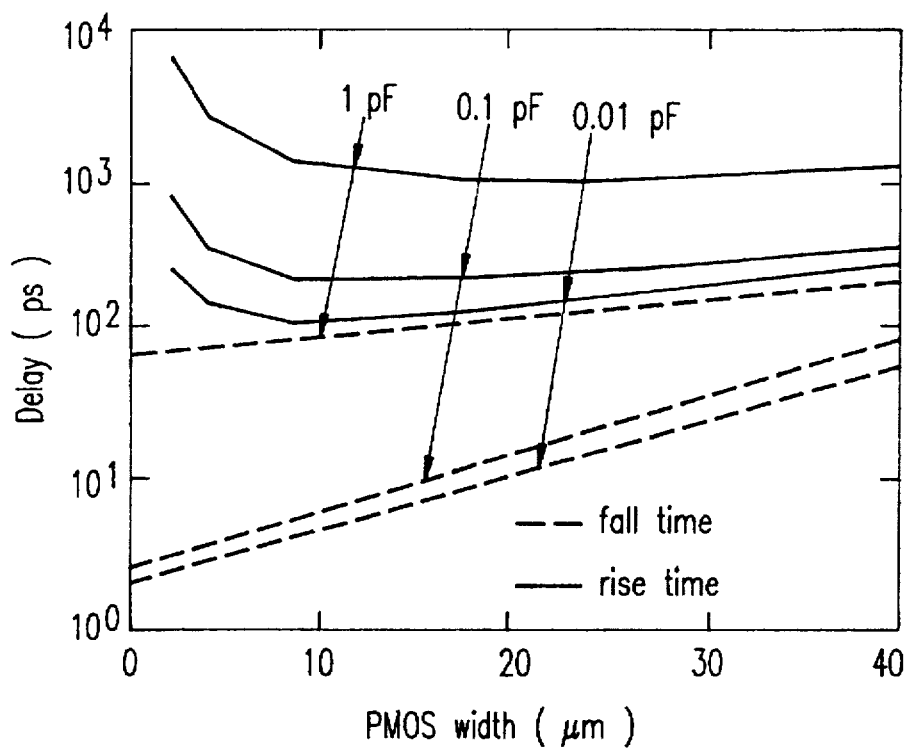
Figure 10:
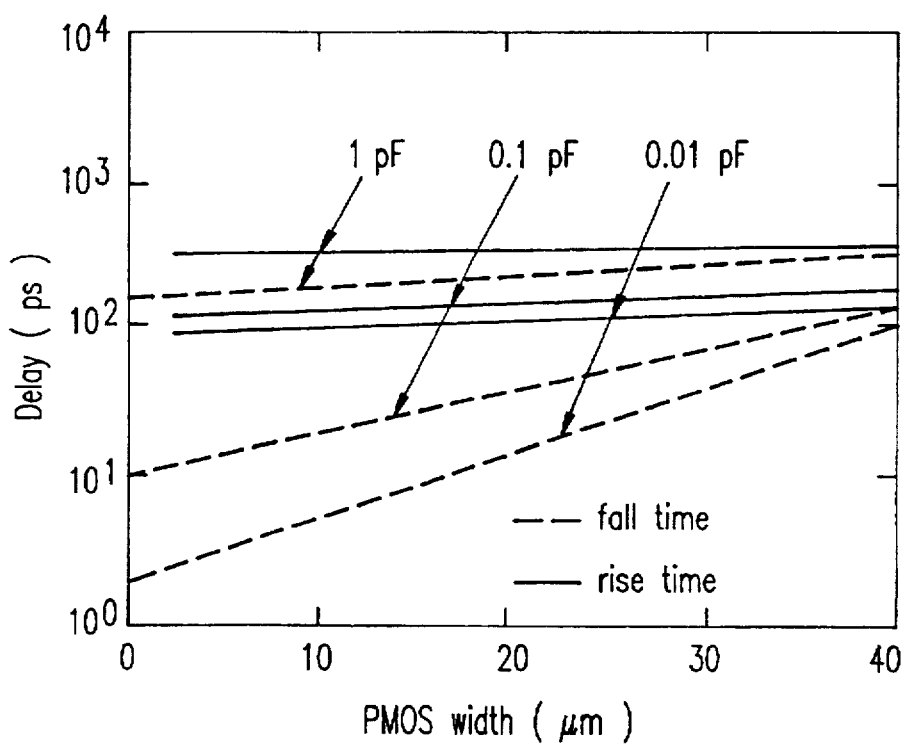
FIG. 10 is a generalized schematic diagram showing preferred static implementations of the invention.

As is known in the art, the signal propagation delay of a DCVS circuit is largely a function of load channel width and the output loading capacitance. Performance of a conventional DCVS circuit such as that depicted in FIG. 1 is shown in FIG. 9 and, for comparison, the performance of the DCVSPG circuit shown in FIG. 3 in accordance with the invention is shown in FIG. 10. It can be readily appreciated that the increase in rise time delay for small load channel width is avoided by the invention and the rise and fall times are shorter and more nearly equal for a given output capacitive loading than in the conventional circuit, indicating an absence of ratioing of output voltage and floating node effects.

Figure 11:
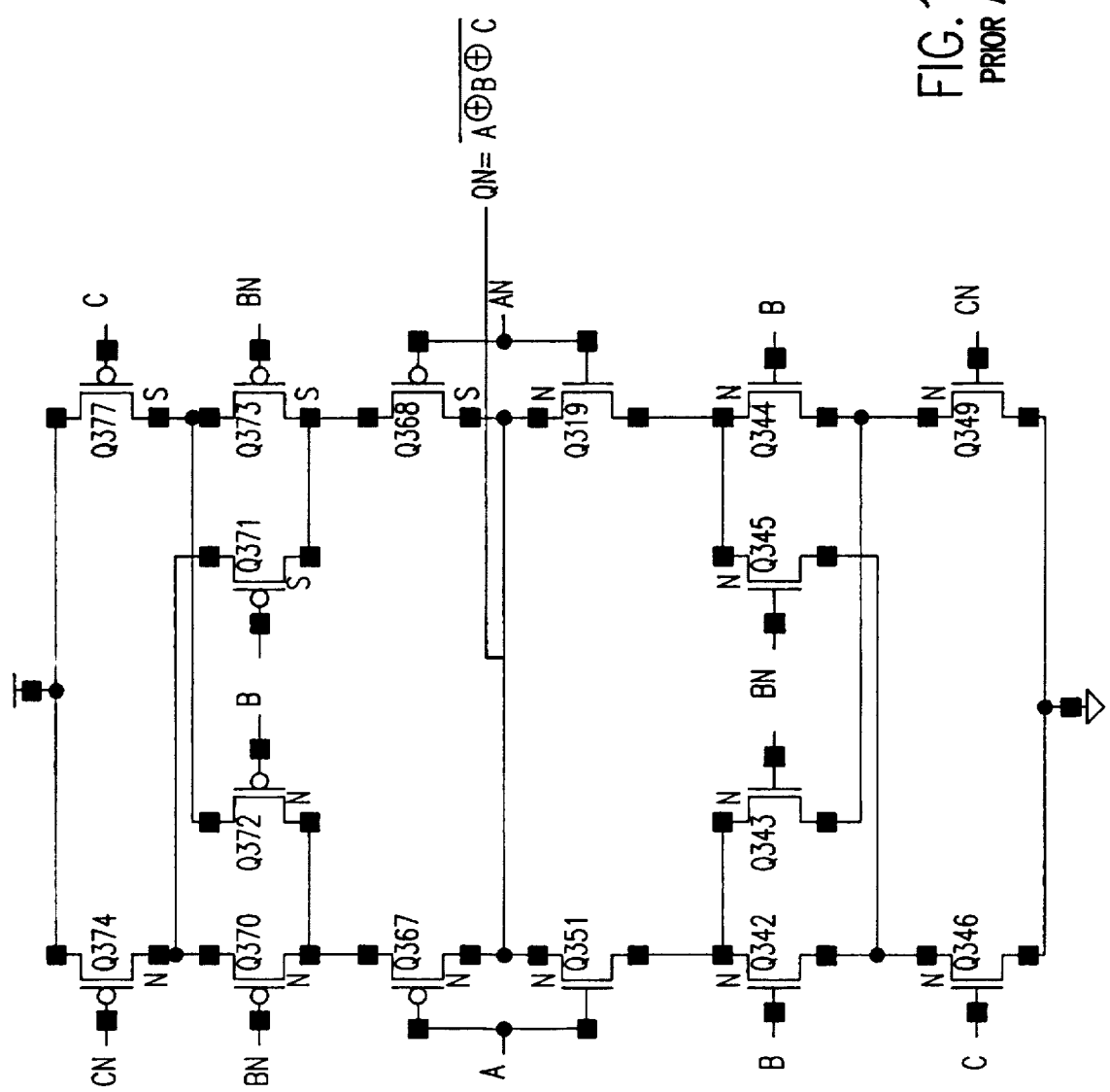
FIGS. 11, 12 and 13 are schematic diagrams of the 3-input sum circuit of a conventional form in static CMOS, static DCVS and dynamic DCVS circuits, respectively.
Figure 13:
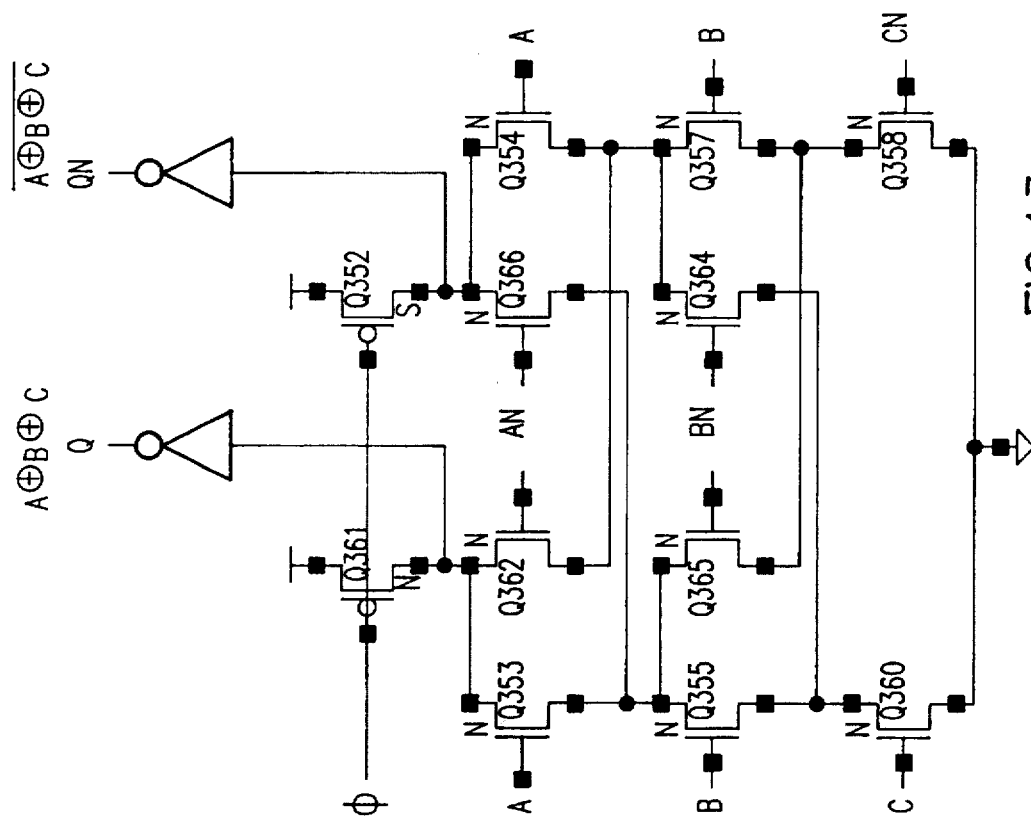
Figure 12:
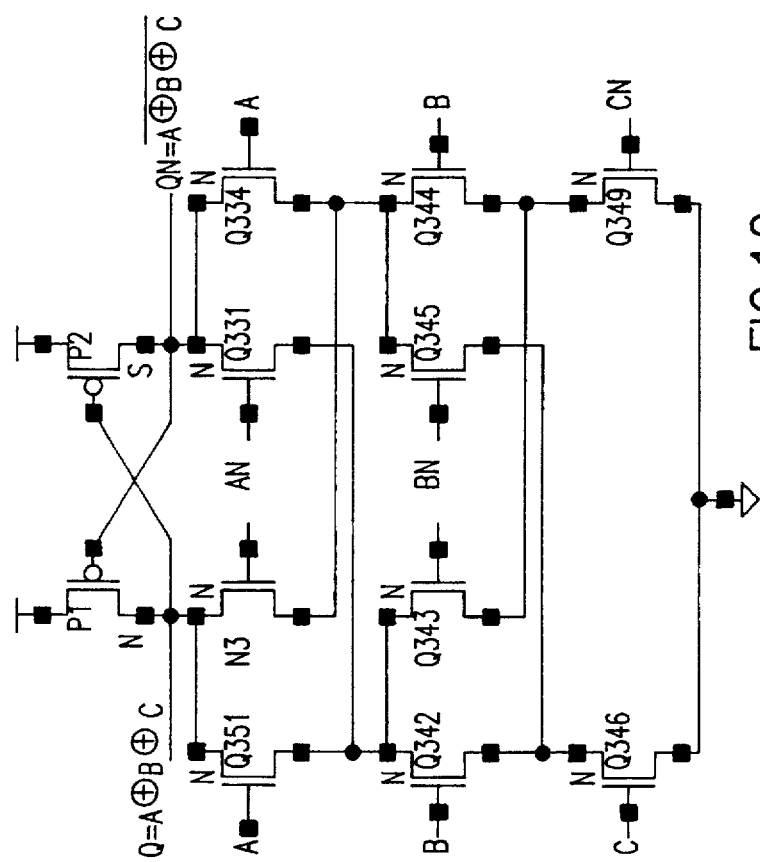

In order to compare the circuit performance of the invention with conventional designs, a 3-input XOR/XNOR sum circuit will now be considered. FIG. 11 shows a conventional 3-input sum circuit. FIGS. 12 and 13 illustrate static and dynamic versions of conventional DCVS circuits, respectively. The PMOS device size is chosen as twice that of the NMOS devices. It should be noted in FIGS. 11, 12 and 13 that transistors having complementary inputs are arranged in series connected pairs along the possible discharge paths from the output nodes Q, $Q_N$ but that one output node must float during evaluation of any combination of values of input variables. Charge leakage and charge-sharing problems such as those described above will be increased relative to 2-input circuits because of the greater number of nodes; each of which has a finite parasitic capacitance of generally similar value.

Figure 15:
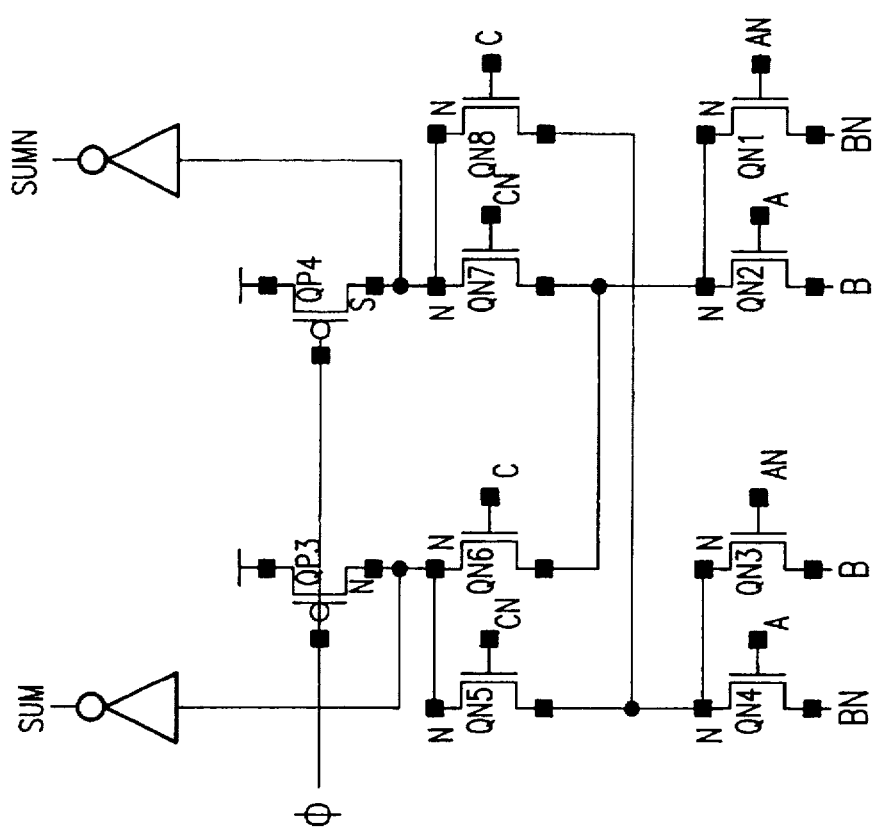
FIGS. 14 and 15 are schematic diagrams of 3-input sum circuits in accordance with the invention.
Figure 14:
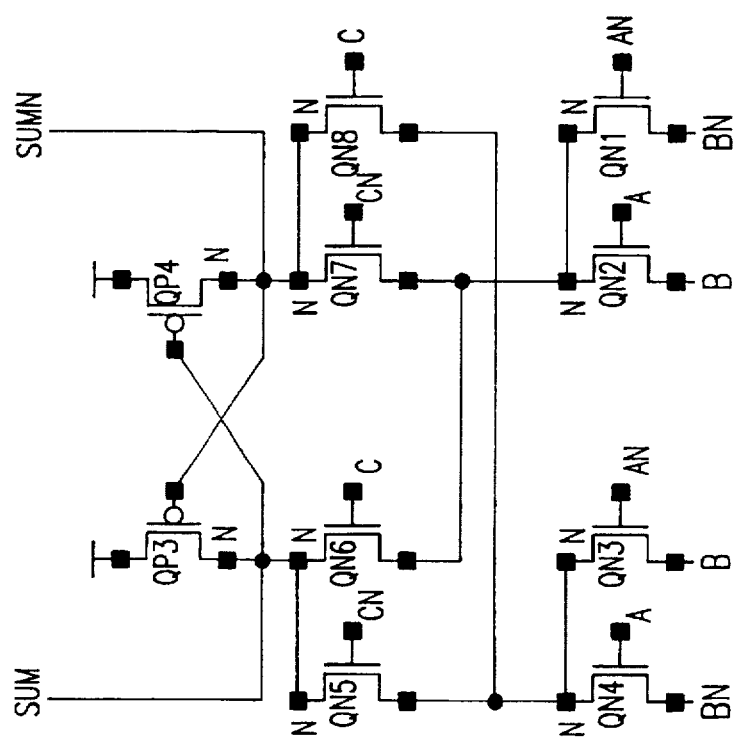

FIGS. 14 and 15 respectively illustrate static and dynamic DCVSPG circuits in accordance with the invention having similar logic functions as that of FIGS. 11–13. It should be noted that these circuits have reduced logic tree height and highly symmetrical charging and discharging paths in which the evaluation of any combination of values of input variables will connect both output nodes to a logic level voltage. The DCVSPG circuits of FIGS. 14 and 15 also have area advantages since the number of redundant PMOS transistors are reduced dramatically compared with the conventional DCVS circuit configurations of FIGS. 11–13.

A further comparison of the advantageous effects of the invention are quantitatively evaluated in terms of input/output capacitance, layout density, circuit delay, power dissipation and power-delay product in comparison with the conventional DCVS circuit and static CMOS in FIG. 16 in tabular form. It can readily be seen that for either static or dynamic embodiments, input and output capacitance is much lower than CMOS logic or the conventional DCVS circuits. The number of transistors of each of PMOS and NMOS types is reduced and the required normalized chip area is smaller for the DCVSPG of the invention than for known circuits. Signal propagation delay and power dissipation are also both reduced for the DCVSPG of the invention than for known devices and the product of these values, as a figure of merit, is thus substantially reduced.

It will be readily apparent to those skilled in the art, in view of the present description of the invention, that logic circuits in accordance with the invention can be employed in any digital information signal processing circuit where a logic function is required, including microprocessors and discrete logic circuits. However, in order to convey an understanding of the extent of the logic circuit family considered to be provided within the scope of the invention, a 64-bit self clocked dynamic adder will now be described with reference to FIGS. 17–21.

Figure 17:
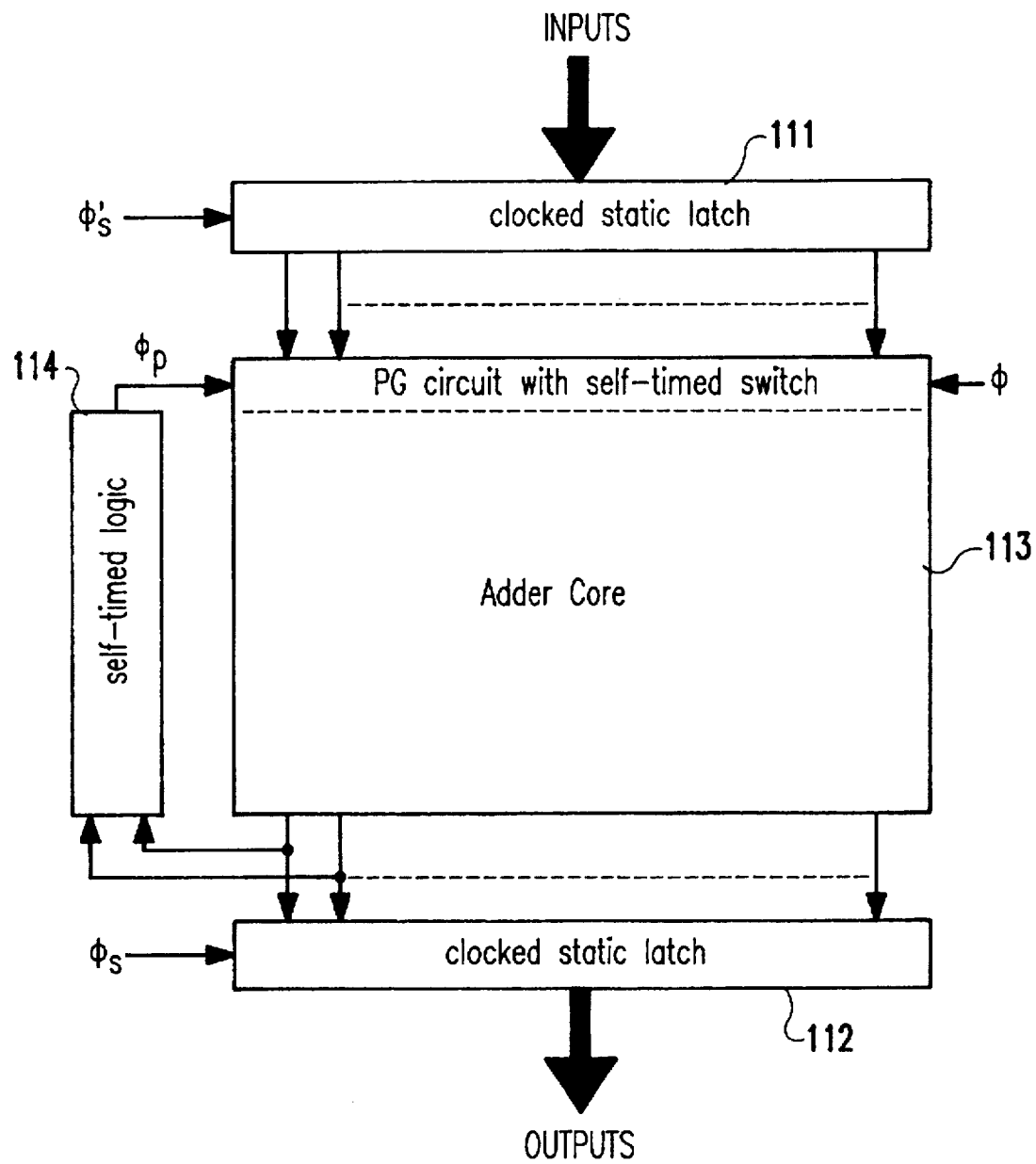
FIGS. 17 and 18 illustrate an exemplary application of the principles of the invention to a self-timed 64 bit adder circuit.
Figure 18:
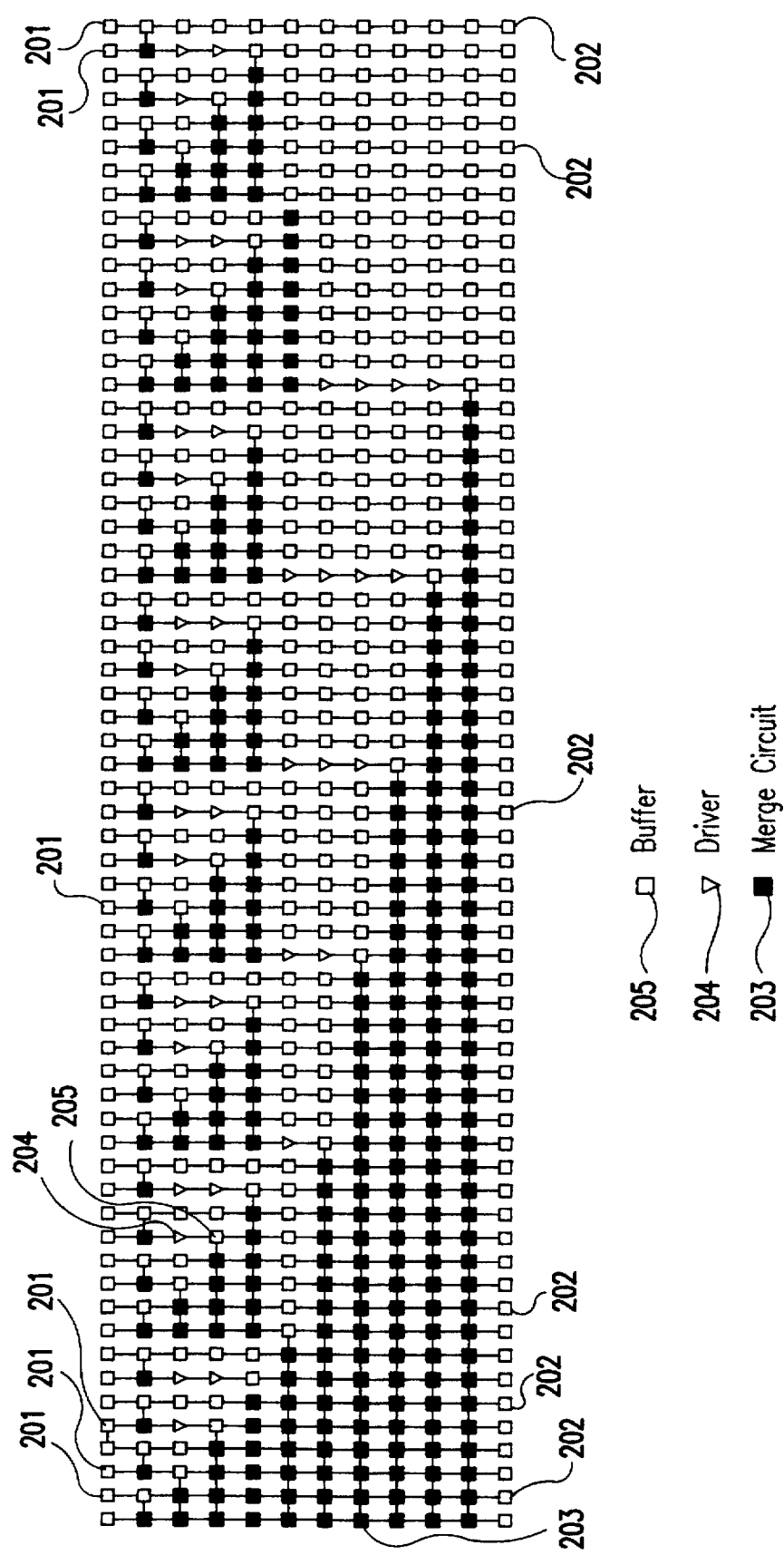

The major functional components of the adder are shown in FIG. 17. The adder needs only a system clock signal φ and generates all other timing signals internally. Specifically, $\phi_P$ is the precharge clock signal, $\phi_S$ is the evaluation signal and $\phi_S'$ is the evaluation signal from the previous block. Self-timed logic 114 simply detects a change in output of the adder core and generates a pulse $\phi_P$ to initiate reset and precharge of the entire adder core in a manner well-understood in the art. All input and output signals are latched in static latches 111, 112. The propagate-generate (PG) circuit 201 and the logic to perform the adder function are formed within an adder core 113 which is schematically shown in FIG. 18 in which there are twelve rows of circuits; the first being the PG circuit 201 to generate the propagate signals p, pn and the generate signals g, gn. The circuit symbolized by each white rectangular symbol in this row is shown in detail in FIG. 19. The last row is the sum circuit 202; each white rectangular box in this row symbolizing the circuit shown in detail in FIG. 21.

The intervening ten rows generate the carry signals. The white rectangular symbols in these rows depict buffer circuits 205 and the white triangular symbols depict driver circuits 204, both of which are well understood in the art. The black rectangular symbols depict merge circuits 203 which are shown in detail in FIG. 20. Some of the buffer circuits 205 are arranged to route signals arriving from the top of each buffer circuit to a merge circuit 203 immediately to its left. The sum bit 0 comes from the right-hand side.

Briefly reviewing PG circuit 201 of FIG. 18, it is seen that the logic is implemented as a pair of two logic gates as described above with reference to FIGS. 4–7 with the load transistors controlled by evaluation signal $\phi_S$ generated in response to a leading edge of clock signal φ, as discussed above in connection with the dynamic DCVSPG circuit of FIG. 4. Precharge transistors are serially connected with the load transistors and controlled by precharge signal $\phi_P$. The logic of circuit 131 combines the precharge signal with the evaluation signal so that the load and precharge transistors are not simultaneously conductive and $\phi_P$ can be used to chop and reset $\phi_S$.

Figure 19:
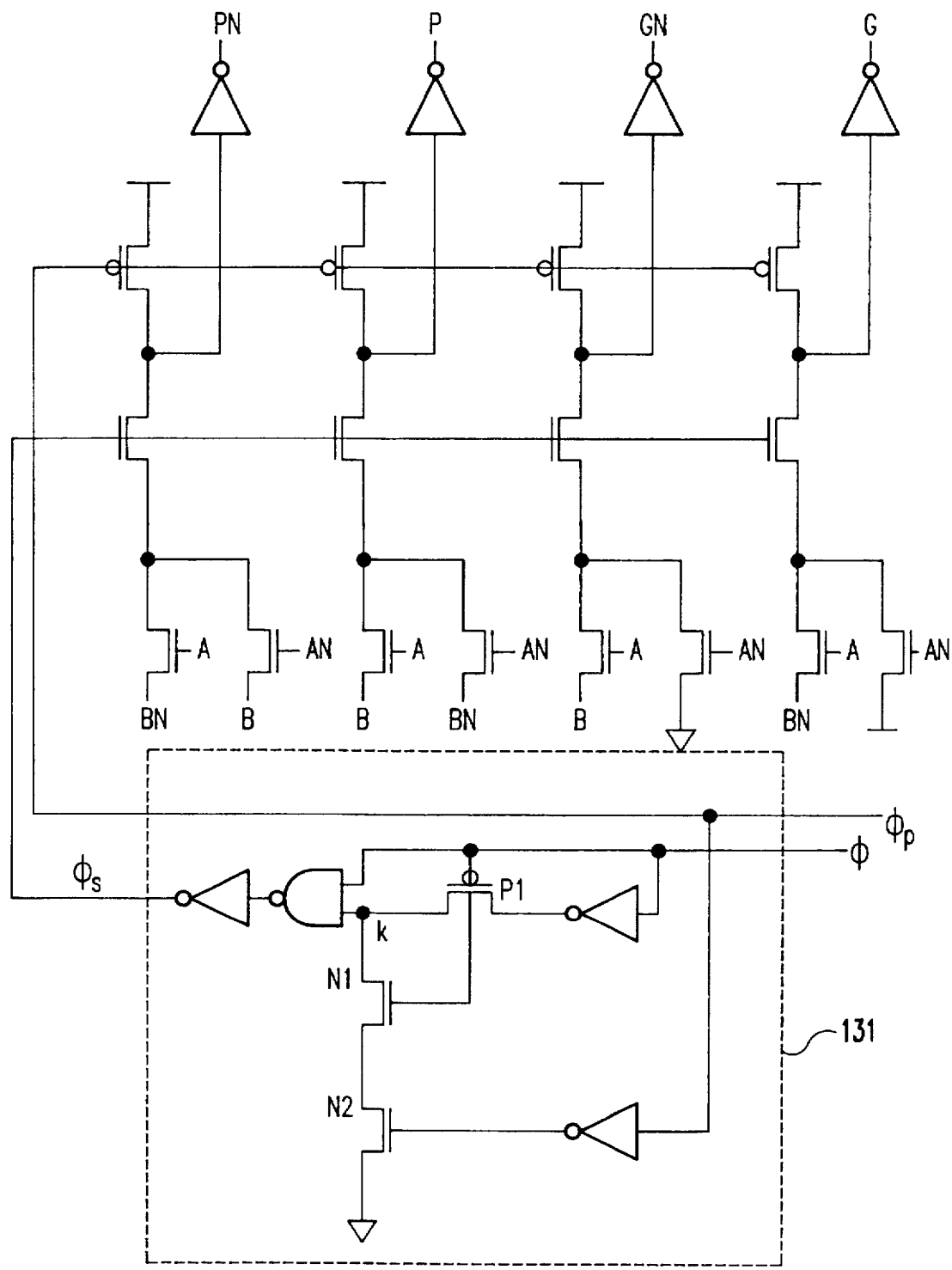
FIGS. 19, 20 and 21 are exemplary circuits symbolically depicted in FIG. 18.
Figure 20:
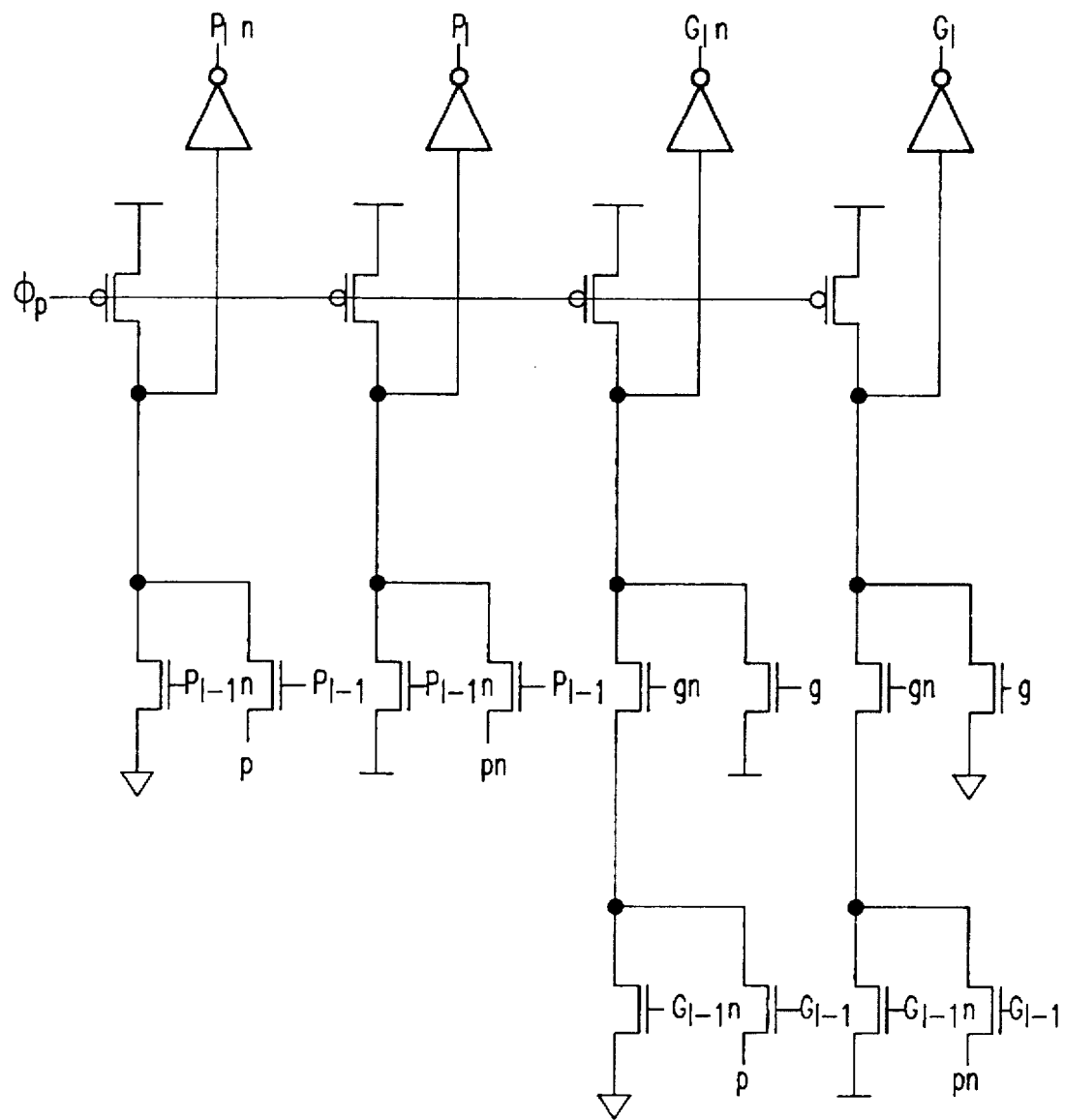

Similarly, the merge circuit 203 of FIG. 20 is preferably implemented in the same manner as the circuit of FIG. 19 with two pairs of gates but provision is made for merging the p and g signals with the $P_{i-1}$ and $G_{i-1}$ signals. For the generate signals g, the transistor stack height of the pass gate tree will be two transistors. However, both sides of the logic tree providing the merging function are the same height and floating node (e.g. charge sharing and/or charge leakage) effects continue to be avoided.

Figure 21:
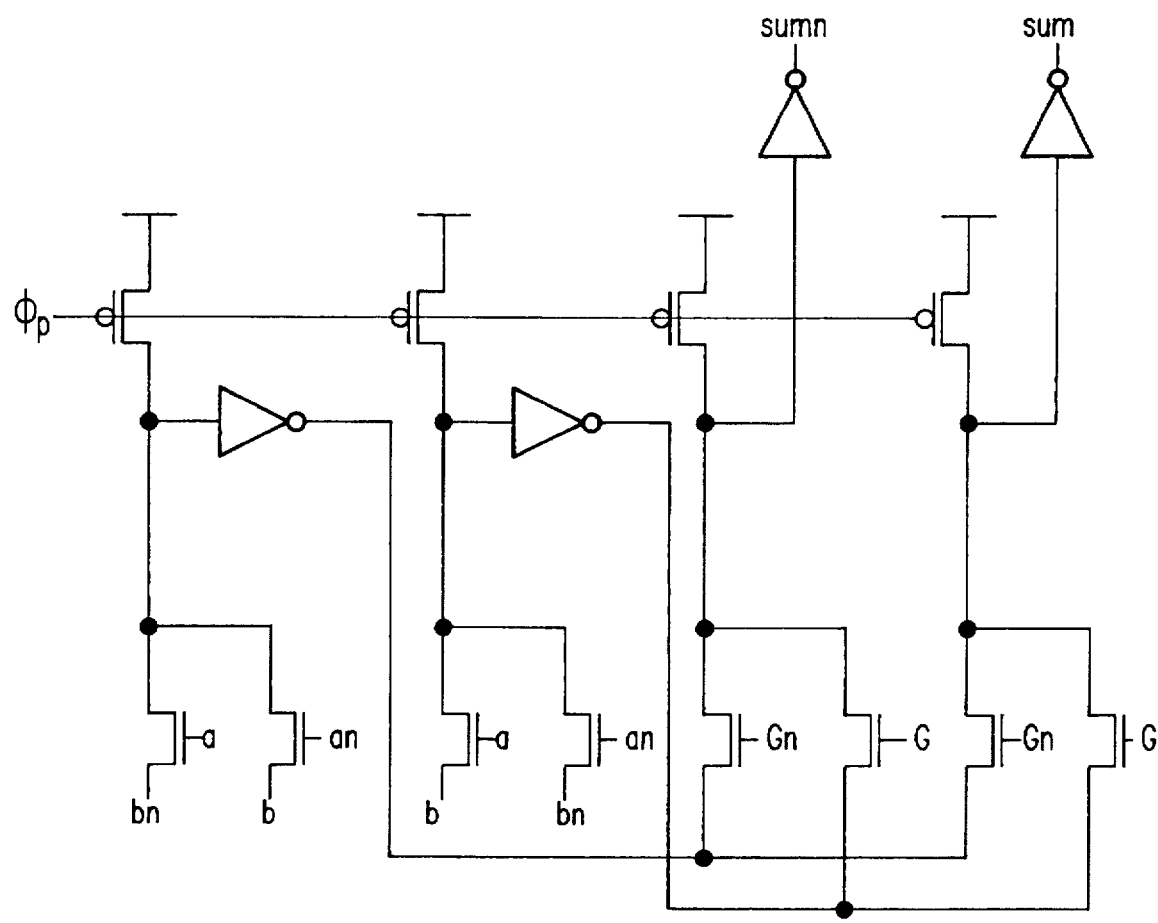

The sum circuit 202 of FIG. 21 uses two pass gate logic trees with the logic output of one connected to the conduction terminals of the other. No load transistors are required since the outputs are buffered by inverters and immediately latched by static latches.

At the beginning of an operation of the adder, it is assumed that the adder has been reset and precharged to a stand-by state. When the clock signal φ goes high, $\phi_S$ is generated and the signals which have been latched by the static latches 111 are evaluated by the circuit of FIG. 13 and the signal ripples through the adder including the circuits of FIG. 14 from the top row to the bottom row (containing the circuits of FIG. 15. When a change of output state is detected at the bottom row, the output is latched in static latches 112, the self-timed logic block sets $\phi_P$ low which terminates $\phi_S$ and precharging can occur. $\phi_P$ then returns to a high state in response to the self-timed logic 114 and the entire adder is thus returned to the standby condition.

The above example is regarded as a particularly advantageous application of the principles of the invention to a large and complex logic array. However, it is to be understood that this application is considered to be merely exemplary of the application of the principles of the invention and the variety of the family of logic circuits which can be provided and which will exhibit improved performance within the scope of the invention.

In view of the foregoing, it is seen that a DCVSPG circuit has been provided by the invention; having improved performance, freedom from floating node, ratioing of output voltages and charge sharing effects in comparison with DCVS designs. Additionally, the invention provides standardization of transistor layout and is capable of being manufactured at high integration density with high manufacturing yield together with simplification of design since the logic functions performed ar determined in accordance with the connection of input signals rather than by the internal interconnection of transistors.

While the invention has been described in terms of a single preferred embodiment, those skilled in the art will recognize that the invention can be practiced with modification within the spirit and scope of the appended claims.

Having thus described my invention, what we claim as new and desire to secure by Letters Patent is as follows:

1. A dual rail logic circuit comprising
    a symmetrical pair of logic trees comprising a first logic tree and a second logic tree, both said first logic tree and said second logic tree comprising pass gates of equal stack height, said symmetrical pair of logic trees including input means for deriving any of the logic functions including AND, OR, NAND, NOR, XOR and XNOR from the combined function of said first logic tree and said second logic tree, wherein
    said first and second logic trees each include two transistors, each of said two transistors having a control terminal and first and second conduction terminals, said first conduction terminal of each of said two transistors being connected to an output node of said dual rail logic circuit, and wherein
    said input means includes said control terminals and said second conduction terminals of said first and second transistors, said control terminals of said first and second transistors being connected to receive true and complement signals corresponding to a first logic variable, respectively, and wherein
    said second conduction terminal of said first transistor of said first and second logic trees may be selectively connected to receive true and complement signals corresponding to a second logic variable or logical combination of further logic variables, respectively, and said second conduction terminal of said second transistor of said first and second logic trees being respectively connected to a power supply voltage and a reference voltage, whereby said first and second transistors of said first logic tree provide a NAND function and said first and second transistors of said second logic tree provide an AND function,
    said second conduction terminal of said first transistor of said first and second logic trees may be selectively connected to a reference voltage and a power supply voltage, respectively, and said second conduction terminal of said second transistor of said first and second logic trees being respectively connected to receive complement and true signals corresponding to a second logic variable or logical combination of further logic variables, whereby said first and second transistors of said first logic tree provide a NOR function and said first and second transistors of said second logic tree provide an OR function, and
    said second conduction terminal of said first transistor of said first and second logic trees may be selectively connected to receive true and complement signals corresponding to a second logic variable or logical combination of further logic variables, respectively, and said second conduction terminal of said second transistor of said first and second logic trees being respectively connected to receive complement and true signals corresponding to said second logic variable or logical combination of further logic variables, whereby said first and second transistors of said first logic tree provide an XNOR function and said first and second transistors of said second logic tree provide an XOR function.

2. A logic circuit as recited in claim 1 wherein said stack height is not greater than two transistors.

3. A logic circuit as recited in claim 1 wherein said stack height is one transistor.

4. A logic circuit as recited in claim 1 further including means for receiving true and complement logic signals corresponding to at least two input signals, and wherein each of said first and second logic trees receive at least some true and complement logic signals corresponding to each of said at least two input signals.

5. A logic circuit as recited in claim 4 wherein said stack height of said first and second logic trees is not greater than two transistors.

6. A logic circuit as recited in claim 4 wherein said stack height is one transistor.

7. A logic circuit as recited in claim 1, wherein said first and second logic trees are comprised of circuits substantially identical circuit topology.

8. A logic circuit as recited in claim 1, wherein both of said first and second logic trees unconditionally provide a connection to a voltage of one of two logic levels.

9. A logic circuit as recited in claim 1, further including a transistor connected to each of said first and second logic trees.

10. A logic circuit as recited in claim 9, wherein said transistors connected of said first and second logic trees are cross-coupled load transistors.

11. A logic circuit as recited in claim 9, wherein said transistors connected of said first and second logic trees are precharge transistors connected to receive a common precharge signal.

12. A dual rail logic circuit comprising
    first and second output nodes,
    a logic circuit means connected to each of said first and second output nodes for receiving logic level voltages corresponding to respective true and complement values of a plurality of input variables and for respectively connecting said first and second output nodes to a logic level voltage for all combinations of said logic level voltages received by said logic circuit means, said logic circuit means including a symmetrical pair of logic trees of equal stack height and including input means for deriving any of the logic functions including AND, OR, NAND, NOR, XOR and XNOR from the combined function of said first logic tree and said second logic tree, wherein
    said first and second logic trees each include two transistors, each of said two transistors having a control terminal and first and second conduction terminals, said first conduction terminal of each of said two transistors being connected to an output node of said dual rail logic circuit, and wherein
    said input means includes said control terminals and said second conduction terminals of said first and second transistors, said control terminals of said first and second transistors being connected to receive true and complement signals corresponding to a first logic variable, respectively, and wherein
    said second conduction terminal of said first transistor of said first and second logic trees may be selectively connected to receive true and complement signals corresponding to a second variable, respectively, and said second conduction terminal of said second transistor of said first and second logic trees being respectively connected to a power supply voltage and a reference voltage, whereby said first and second transistors of said first logic tree provide a NAND function and said first and second transistors of said second logic tree provide an AND function,
    said second conduction terminal of said first transistor of said first and second logic trees may be selectively connected to a reference voltage and a power supply voltage, respectively, and said second conduction terminal of said second transistor of said first and second logic trees being respectively connected to receive complement and true signals corresponding to a second logic variable or logical combination of further logic variables, whereby said first and second transistors of said first logic tree provide a NOR function and said first and second transistors of said second logic tree provide an OR function, and said second conduction terminal of said first transistor of said first and second logic trees may be selectively connected to receive true and complement signals corresponding to a second logic variable or logical combination of further logic variables, respectively, and said second conduction terminal of said second transistor of said first and second logic trees being respectively connected to receive complement and true signals corresponding to said second logic variable or logical combination of further logic variables, whereby said first and second transistors of said first logic tree provide an XNOR function and said first and second transistors of said second logic tree provide an XOR function.

13. A logic circuit as recited in claim 12, further including a transistor connected to each of said first and second output nodes.

14. A logic circuit as recited in claim 13, wherein said transistors connected to said first and second output nodes are load transistors.

15. A logic circuit as recited in claim 14, wherein said load transistors are cross-coupled.

16. A logic circuit as recited in claim 13, wherein said transistors connected to said first and second output nodes are precharge transistors connected to receive a common precharge signal.

17. A logic circuit as recited in claim 12, wherein said logic circuit means are comprised of circuits substantially identical circuit topology.

18. A logic circuit as recited in claim 12, wherein said logic circuit means comprise a pair of circuits of equal stack height.

19. A logic circuit including at least two serially connected logic stages, each of said at least two serially connected logic stages including first and second output nodes, and a logic circuit means connected to each of said first and second output nodes for receiving logic level voltages corresponding to respective true and complement values of a plurality of input variables and for respectively connecting said first and second output nodes to a logic level voltage for all combinations of said logic level voltages received by said logic circuit means, said logic circuit means including a symmetrical pair of logic trees of equal stack height and including input means for deriving any of the logic functions including AND, OR, NAND, NOR, XOR and XNOR from the combined function of said first logic tree and said second logic tree, wherein said first and second logic trees each include two transistors, each of said two transistors having a control terminal and first and second conduction terminals, said first conduction terminal of each of said two transistors being connected to an output node of said dual rail logic circuit, and wherein said input means includes said control terminals and said second conduction terminals of said first and second transistors, said control terminals of said first and second transistors being connected to receive true and complement signals corresponding to a first logic variable, respectively, and wherein said second conduction terminal of said first transistor of said first and second logic trees may be selectively connected to receive true and complement signals corresponding to a second variable, respectively, and said second conduction terminal of said second transistor of said first and second logic trees being respectively connected to a power supply voltage and a reference voltage, whereby said first and second transistors of said first logic tree provide a NAND function and said first and second transistors of said second logic tree provide an AND function, said second conduction terminal of said first transistor of said first and second logic trees may be selectively connected to a reference voltage and a power supply voltage, respectively, and said second conduction terminal of said second transistor of said first and second logic trees being respectively connected to receive complement and true signals corresponding to a second logic variable or logical combination of further logic variables, whereby said first and second transistors of said first logic tree provide a NOR function and said first and second transistors of said second logic tree provide an OR function, and said second conduction terminal of said first transistor of said first and second logic trees may be selectively connected to receive true and complement signals corresponding to a second logic variable or logical combination of further logic variables, respectively, and said second conduction terminal of said second transistor of said first and second logic trees being respectively connected to receive complement and true signals corresponding to said second logic variable or logical combination of further logic variables, whereby said first and second transistors of said first logic tree provide an XNOR function and said first and second transistors of said second logic tree provide an XOR function.

20. A logic circuit as recited in claim 19, wherein said logic circuit is a multi-bit logical adder.

* * * * *